(12) United States Patent
Kirst

(10) Patent No.: US 10,802,046 B2
(45) Date of Patent: Oct. 13, 2020

(54) MEASUREMENT ARRANGEMENT

(71) Applicant: Endress+Hauser Conducta GmbH+Co. KG, Gerlingen (DE)

(72) Inventor: Michael Kirst, Lörrach (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 526 days.

(21) Appl. No.: 15/846,744

(22) Filed: Dec. 19, 2017

(65) Prior Publication Data

US 2018/0172729 A1    Jun. 21, 2018

(30) Foreign Application Priority Data

Dec. 20, 2016  (DE) .................. 10 2016 125 038
Mar. 17, 2017  (DE) .................. 10 2017 105 809

(51) Int. Cl.
| | |
|---|---|
| G01N 33/00 | (2006.01) |
| G01D 11/24 | (2006.01) |
| G01D 5/12 | (2006.01) |
| G01D 21/00 | (2006.01) |
| G01D 3/08 | (2006.01) |
| G01D 3/10 | (2006.01) |
| G01R 1/04 | (2006.01) |
| H01R 13/66 | (2006.01) |
| H04B 5/00 | (2006.01) |

(Continued)

(52) U.S. Cl.
CPC .............. *G01R 1/0416* (2013.01); *G01D 3/08* (2013.01); *G01D 3/10* (2013.01); *H01R 13/6683* (2013.01); *H04B 5/0012* (2013.01); *H04B 5/0075* (2013.01); *H01Q 1/2291* (2013.01); *H01R 2201/20* (2013.01); *H04L 25/0266* (2013.01)

(58) Field of Classification Search
CPC .. G01N 27/286; G01N 33/0009; G01D 11/24; G01D 11/245; G01D 18/002; G01D 21/00
See application file for complete search history.

(56) References Cited

U.S. PATENT DOCUMENTS

2015/0007636 A1*  1/2015  Benkert .............. G01N 33/00
                                                         73/23.2
2015/0032386 A1*  1/2015  Pechstein ............ H01F 38/14
                                                          702/30

(Continued)

FOREIGN PATENT DOCUMENTS

DE   102011107717 A1   3/2012
EP       2233994 B1    4/2014

*Primary Examiner* — Herbert K Roberts
(74) *Attorney, Agent, or Firm* — Mark A. Logan; Endress+Hauser (USA) Holding Inc.

(57) ABSTRACT

The present disclosure relates to a measurement arrangement including a sensor, an electronics module, a signal cable having a cable circuit, and a superordinate unit. The sensor is releasably pluggable to the electronics module which itself is releasably pluggable to the signal cable. The signal cable is connected with the superordinate unit. The plug connections between the sensor and the electronics module and between the electronics module and the signal cable may be galvanically isolated. The sensor outputs digital data in a first format to the electronics module. The electronics module outputs digital data in a second format to the signal cable. The superordinate unit is configured to receive and to process the digital data in the second format.

19 Claims, 4 Drawing Sheets

(51) Int. Cl.
*H04L 25/02* (2006.01)
*H01Q 1/22* (2006.01)

(56) References Cited

U.S. PATENT DOCUMENTS

| | | | |
|---|---|---|---|
| 2015/0120231 A1* | 4/2015 | Jagiella | G01D 21/00 |
| | | | 702/91 |
| 2015/0155892 A1* | 6/2015 | Haase | H01Q 1/2291 |
| | | | 455/129 |
| 2019/0145944 A1* | 5/2019 | Benkert | G01N 33/0009 |
| | | | 73/23.2 |
| 2019/0265675 A1* | 8/2019 | Zutz | G05B 19/4063 |

* cited by examiner

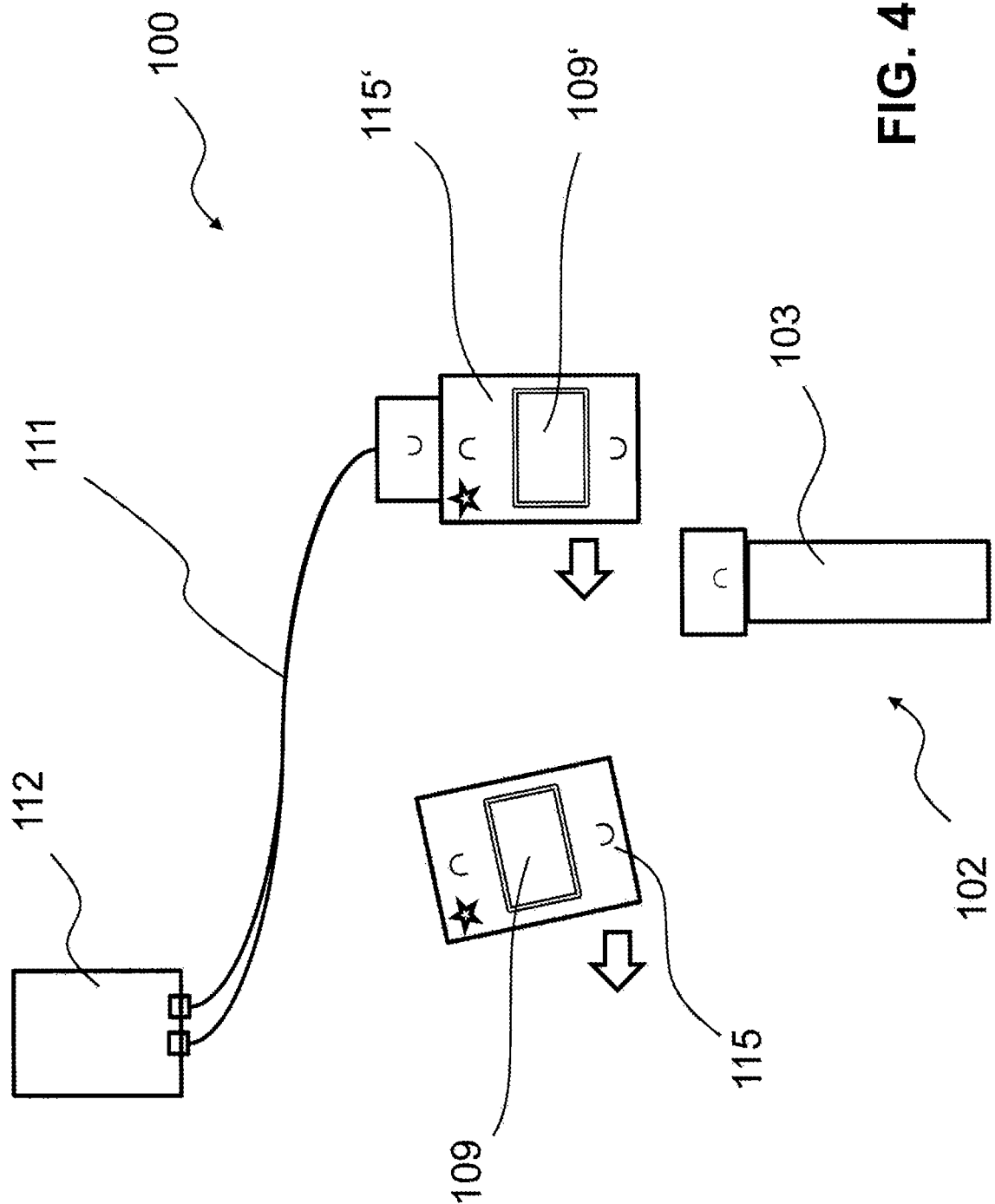

MEASUREMENT ARRANGEMENT

CROSS-REFERENCE TO RELATED APPLICATIONS

The present application is related to and claims the priority benefit of German Patent Application Nos. 10 2016 125 038.4, filed on Dec. 20, 2016, and 10 2017 105 809.5, filed on Mar. 17, 2017, the entire contents of which are incorporated herein by reference.

TECHNICAL FIELD

The present disclosure relates to a measurement arrangement, a modular system for forming a measurement arrangement, and a method for putting a measurement arrangement into operation.

BACKGROUND

In industrial metrology or analytical metrology, measurement arrangements are used to monitor measured quantities in processes, e.g., pH value, conductivity, partial pressure of a dissolved gas, concentration of an analyte in a measurement solution, or temperature. They often comprise a sensor and a measuring transducer that are normally connected to one another via a cable and one or more plug connector couplings. The sensor is designed to be brought into contact with a measurement medium, and to generate measurement signals dependent upon the measured quantity in the measurement medium and output them to the measuring transducer. The measuring transducer is designed to receive and process the measurement signals for example, in that it determines values of the measuring transducer using the measurement signal. The measuring transducer may have an indicator, e.g., a display, by means of which it may present the values of the measured quantity for a user. Moreover, the measuring transducer may have an input device, e.g., in the form of an operating button, a keyboard, and/or a rotary switch/pushbutton, by means of which the measuring transducer or the sensor can be operated by a user. For example, the operation may include the input of parameters or commands. Measuring transducers that are used in industrial metrology normally additionally comprise a fieldbus interface via which they can be connected via a fieldbus to a superordinate unit for example, a process control center or a programmable logic controller. These measuring transducers are designed to output the determined values of the measured quantity via the fieldbus interface in the form of a digital signal or telegram according to a communications protocol that can be processed by the superordinate unit. In industrial metrology, typical communications protocols that can normally be processed by process control systems and controllers are, for example, fieldbus protocols according to the IEC 61784-1 or IEC 61784-2 standards, e.g., Foundation Fieldbus, PROFIBUS, PROFINET, CAN, HART, or Modbus. Process control systems and industrial process controllers normally cannot process signals according to proprietary protocols that are used in the individual measurement arrangements connected to the superordinate unit.

A measurement arrangement 1 known in the prior art is schematically depicted in FIG. 1. The measurement arrangement 1 has a sensor 2 that comprises a measurement sensing element 3, e.g., a potentiometric pH measurement sensing element, and sensor electronics accommodated in an electronics housing 4 that is firmly connected to said measurement sensing element 3. Moreover, integrated into the electronics housing 4 is a first plug connector element that can be connected, so as to be releasable again, to a second plug connector element 5 that is complementary to the first plug connector element to form a plug connector coupling 6. The plug connector coupling 6 may be a galvanically separated, inductively-coupling plug connector coupling. The second plug connector element 5 is connected via a cable 7 to a measuring transducer 8 that comprises a housing with measuring transducer electronics 9 accommodated therein. The sensor electronics are designed to output the digital measurement signal according to a proprietary communications protocol via the plug connector coupling 6 and the cable 7 to the measuring transducer electronics 9. These measuring transducer electronics 9 are designed to determine a value of the measured quantity using the measurement signal and to output this value to a display (not shown). The measuring transducer 8 has a fieldbus interface 10 via which it is connected to a fieldbus 11 and to a superordinate unit 12 (here, a programmable logic controller) to control a process that is also, among other things, based upon the measurement values delivered by the measurement arrangement. The superordinate unit 12 is not set up to process digital signals according to the proprietary communications protocol. The measuring transducer electronics 9 are designed to output the determined value of the measured quantity as a digital signal or telegram according to a standard industry protocol, e.g., one of those cited above, to the superordinate unit 12 via the interface 10 and the fieldbus 11. In the measurement arrangement 1 presented here, the measuring transducer 8 serves not only to determine, indicate, and relay measurement values, but also for on-site operation of the measurement arrangement at the measurement site. Such a measurement arrangement is offered by the applicant.

Moreover, in the prior art, intelligent sensors have become known that have sensor electronics firmly connected to the measurement sensor element, which sensor electronics are designed to convert the analog measurement signal into a digital measurement value of the measured quantity, and to output the measured value in the form of a digital signal according to a standard industry protocol that can be processed by a superordinate unit (such as an SPS or a process control center) for example, according to one of the aforementioned industry sensors.

In EP 2 233 994 B1, a measurement arrangement is thus described which comprises an intelligent process sensor that, on the one hand, realizes the retrieval and digitization of measurement data and, on the other hand, has a digital interface and an analog 4 . . . 20 mA interface. Via these interfaces, the process may communicate directly to a process control system without using a conventional measuring transducer for example, the aforementioned measuring transducer. The standardized Modbus protocol serves for digital communication with the process control system. In order to operate for example, calibrate the sensor on-site, an electronics module can be introduced, via a releasable plug connector, into the connecting line between the intelligent process sensor and the process control system. The electronics module takes on the function of a router for the digital, wired communication between sensor and process control system, and for digital, wireless, or wired communication between the process sensor and an operator device connected via wires or wirelessly to the electronics module. Moreover, the electronics module may relay the analog signals provided by the sensor via an analog 4 . . . 20 mA interface.

From DE 10 2011 107 717 A1, an intelligent sensor is known that comprises a measurement sensor element and sensor electronics that are provided for detecting the analog measurement values and digitizing said analog measurement values. The sensor electronics are additionally designed to export the measurement values and execute their preparation for a transmission via a bus system to the external conductor system according to a standard communications protocol of process engineering, and to transfer said measurement values to a superordinate unit via a communications interface and the bus system.

A disadvantage of the measurement arrangements without conventional measuring transducers that also serve as indicator and operator devices, as described in DE 10 2011 107 717 A1 and EP 2 233 994 B1, is that specially designed intelligent sensors are required for these measurement arrangements which differ from sensors that are used in measurement arrangements with conventional measuring transducers. For both the manufacturer and the user, this increases the multitude of variants of sensors and measurement arrangements, and the logistical cost connected with these. For example, if he operates different types of measurement arrangements at different measurement locations, e.g., those having conventional measuring transducers (such as the measurement arrangement presented in FIG. 1) and those that manage without a conventional measuring transducer, a user must store and manage the respective different sensors that are required for these.

An additional disadvantage of the path taken in DE 10 2011 107 717 A1 and EP 2 233 994 B1 to provide as much intelligence as possible in the sensor—in particular, namely, pertaining to measurement signal processing and evaluation, as well as the conversion of measurement results into a standardized transmission telegram—is obvious, if the measurement sensor elements are designed as analysis sensors—for example, as amperometric, potentiometric, or optical measurement sensor elements or measurement sensor elements for conductivity measurement. Many of these analysis sensors have only a limited service life and must be regularly exchanged. If the entirety of the intelligence is provided in the sensor, the correspondingly elaborate sensor electronics are also regularly disposed of with the sensors when these have reached the ends of their lives. However, the circuits and switching elements forming the sensor electronics regularly have a significantly longer service life than the measurement sensor element.

Therefore, it is the aim of the present disclosure to specify a measurement arrangement that overcomes these disadvantages. In particular, a measurement arrangement shall be specified that allows a resource-saving sensor exchange. The measurement arrangement shall advantageously allow a conventional measuring transducer to be omitted as needed, but, nevertheless, the measurement arrangement shall be in the position to detect measurement values by means of conventional sensors that can also be used with conventional measuring transducers.

The aim is achieved according to the present disclosure by the measurement arrangement according to claim 1. The present disclosure moreover comprises a modular system according to claim 11 and a method for putting a measurement arrangement according to claim 19 into operation. Advantageous embodiments are listed in the dependent claims.

The measurement arrangement according to the present disclosure comprises:

a sensor which has a measurement sensor element; sensor electronics electrically connected to the measurement sensor element; a first electronics housing surrounding the sensor electronics, said first electronics housing being firmly mechanically connected to the measurement sensor element; and a first plug connector element integrated into the first electronics housing, wherein the measurement sensor element is set up to generate an electrical measurement signal dependent upon a measured quantity of a measurement medium in contact with the sensor, and wherein the sensor electronics are designed to generate a first digital signal derived from the electrical measurement signal according to a first communications protocol, and to output said first digital signal via the first plug connector element;

an electronics module which has converter electronics arranged in a second electronics housing, a second plug connector element integrated into the second electronics housing, which second plug connector element is complementary to the first plug connector element, and a third plug connector element integrated into the second electronics housing, wherein the second plug connector element is connected, so as to be releasable again, to the first plug connector element to form a first plug connector coupling, and wherein the converter electronics are set up to receive the first digital signal transferred via the first plug connector coupling, and, based thereupon, to generate (bridge) a second digital signal according to a second communications protocol that differs from the first communications protocol and output said second digital signal via the third plug connector element;

a superordinate unit; and a signal cable connected to the superordinate unit, having a cable circuit and a third electronics housing surrounding the cable circuit, wherein the signal cable is connected at one end mechanically to the third electronics housing and electrically to the cable circuit, wherein the third electronics housing has a fourth plug connector element connecting, so as to be detachable again, to the third plug connector element to form a second plug connector coupling, said fourth plug connector element being complementary to both the first plug connector element and the third plug connector element, wherein the cable circuit is set up to relay the second digital signal received via the second plug connector coupling to the superordinate unit, and wherein the superordinate unit is set up to receive and process the second digital signal supplied via signal cable—in particular, is, namely, not set up to process the first digital signal or a digital signal according to the first communications protocol.

The electronics module may thus be inserted via plug connector couplings between the sensor and the signal cable connected to the superordinate unit. In contrast to the intelligent process sensors known from EP 2 233 994 B1, having the electronics module connected to the superordinate unit, the electronics module of the present disclosure does not function in such a manner that it merely relays telegrams of the sensor without modification to the superordinate unit, or merely prepares and/or amplifies and forwards telegrams of the sensor; rather, it serves as a bridge or as a transmitter, in that it receives the first digital signal according to a first communications protocol that is received from the sensor and generates and relays to the superordinate unit a second digital signal derived from the first digital signal, said second digital signal being in the form of a telegram according to a second communications protocol that differs from the first communications protocol.

Therefore, by means of the electronics module, it is possible to use conventional sensors—in particular, those that are designed to output digital signals according to a proprietary protocol to a (proprietary) measuring transducer, such as sensor 2 of the measurement arrangement according to the prior art that is presented in FIG. 1—even in measurement arrangements that should manage without conventional measuring transducers (for example, for space reasons), in that the electronics module is introduced between a conventional sensor that requires no additional modification and the signal cable. The electronics module converts the first digital signals received from the sensor according to the proprietary protocol, which the superordinate unit cannot process, into two digital signals according to a different (non-proprietary or standardized) communications protocol that can be processed by the superordinate unit. The user thus requires only one sensor type for measurement locations with and without conventional measuring transducers even measuring transducers serving as indicators and operator devices. In that the generation of digital signals is performed in the electronics module according to a communications protocol that can be processed by the superordinate unit, the corresponding electronic components do not need to be provided in the sensor that has only a limited service life.

The cable circuit may serve as a router or repeater for the digital communication between the electronics module and the superordinate unit. The cable circuit may consequently be designed to forward and, as necessary, to prepare (for example, to amplify) the second digital signal provided by the transducer electronics to the superordinate unit, or to receive if necessary, to prepare digital signals from the superordinate unit according to the second communications protocol from the superordinate unit, and to forward said signals to the transducer electronics. In an advantageous embodiment, the cable circuit is transparent, i.e., conductive, to signals of different protocols. It is consequently set up to provide this router or repeater function independently of which communications protocol a digital signal received via the fourth plug connector element complies with. The cable circuit thus also provides the router or repeater function independently of whether the first digital signal or the second digital signal is transmitted via the fourth plug connector element. The cable circuit may thus receive and forward the first digital signal provided from the sensor according to the first communications protocol, via the fourth plug connector element, if the fourth plug connector element is connected to the first plug connector element. In this instance, the signal cable may be connected at its other end to a conventional measuring transducer that is designed to receive and process the first digital signal according to the first communications protocol.

The transducer electronics may be set up to determine from the first digital signal at least one measurement value for the measured quantity, and may additionally be set up to generate the second digital signal so that it represents the determined measurement value (transmitter).

The first electronics housing and the second electronics housing may respectively be designed, at least in segments, as a hollow cylinder. In particular, they may be designed such that each of the two hollow cylinders has a greatest diameter of less than 20 mm—in particular, of between 12 and 16 mm. This embodiment is adapted to the standard armatures typically used in process engineering, which are often aligned toward a maximum outer sensor diameter of between 12 and 20 mm—in particular, between 12 and 16 mm. In this embodiment, the electronics module has no indicator by means of which its measurement values or other data are displayed so as to be legible to a user, and no input device that can be operated by a user. The third electronics housing may also be designed, at least in segments, as a hollow cylinder—in particular, having a largest outer diameter of less than 20 mm, and, preferably, between 12 and 16 mm.

The electronics housing may be filled at least partially with a casting compound surrounding the circuits contained therein for example, the sensor electronics, the transducer electronics, or the cable circuit. The electronics housing may, in particular, be designed in the manner of an ignition protection encapsulation (Ex-m), and/or such that it satisfies the requirements of the IEC 60079-18:2014 standard. In addition or alternatively, the electronics housing may be protected against the penetration of foreign substances and moisture—in particular, against the penetration of dust and hose water; for example, it may have the IP 65 rating according to the standard IEC 60529:1989+A1:1999+A2:2013 or DIN EN 60529.

The sensor electronics may comprise a non-volatile first memory in which are stored sensor-specific data—in particular, calibrated data of the measurement sensor element and/or data representing additional properties of the measurement sensor element—and wherein the transducer electronics have at least one microprocessor and a non-volatile second memory in which is stored a computer program which can be executed by the microprocessor and which serves to implement at least one of the following steps by means of the microprocessor:

reading out the sensor-specific data in—particular, the calibration data of the measurement sensor element—from the first memory; and determining the at least one measurement value for the measured quantity from the first digital signal received via the first plug connector coupling, using the sensor-specific data.

The calibration data may, for example, be zero point and slope (also designated as rate of rise) of a characteristic sensor curve—in particular, a linear or linearized characteristic sensor curve.

The first communications protocol may be a proprietary communications protocol, viz., a communications protocol that cannot be processed by the superordinate unit.

The second communications protocol may be a non-proprietary protocol—in particular, a standard communications protocol such as a fieldbus protocol according to the IEC 61784-1 standard or the IEC 61784-2 standard, e.g., Foundation Fieldbus, CIP, PROFIBUS, PROFINET, P-NET, INTERBUS, HART, EtherCAT, Ethernet POWERLINK, or Modbus.

In an advantageous embodiment, the first plug connector coupling and/or the second plug connector coupling may be a galvanically separate coupling plug connector coupling— in particular, an inductively or capacitively coupling plug connector coupling. The first plug connector coupling and/or the second plug connector coupling may be set up to transfer—in particular, simultaneously—both data and the electrical power serving to supply the electronics module and/or the sensor. The plug connector couplings may alternatively also be realized by means of conventional galvanic plug contacts.

The measurement arrangement may additionally comprise an operator device—in particular, a portable operator device. The electronics module may comprise at least one communications interface for wireless communication of the transducer electronics with the operator device—in particular, a communications interface designed as a radio interface with transmission and reception unit—wherein the operator device has a communications interface matching the communications interface of the at least one electronics module. Alternatively or additionally, the communications interface of the electronics module may be set up for wireless communication of the transducer electronics with the superordinate unit.

The communication between the transducer electronics and the operator device or the superordinate unit via the interface may take place by means of a radio connection according to a Bluetooth standard—in particular, IEEE 802.15.1 Version 4.0; a wireless HART standard—in particular, IEEE 802.15.4; or a wireless LAN standard—in particular, a standard of the IEEE 802.11 family.

The electronics module may comprise an energy storage—in particular, a capacitor and/or a chemical energy storage, and, preferably, a rechargeable chemical energy storage. This energy storage may, for example, serve to provide additional power in operating phases with increased power consumption in which the power supply via the signal cable is not sufficient for operation of the sensor or for communication with the operator device and/or the superordinate unit.

The present disclosure also comprises a modular system for forming a measurement arrangement—in particular, according to one of the embodiments described in the preceding—comprising:

a sensor which has a measurement sensor element; sensor electronics electrically connected to the measurement sensor element; a first electronics housing surrounding the sensor electronics, said first electronics housing being firmly mechanically connected to the measurement sensor element; and a first plug connector element integrated into the first electronics housing, wherein the measurement sensor element is designed to generate an electrical measurement signal dependent upon a measured quantity of a measurement medium in contact with the sensor, and wherein the sensor electronics are designed to generate a digital signal derived from the electrical measurement signal and to output said digital signal via the first plug connector element according to a first communications protocol;

at least one electronics module which has converter electronics arranged in a second electronics housing, a second plug connector element integrated into the second electronics housing, which second plug connector element is complementary to the first plug connector element, and a third plug connector element integrated into the second electronics housing, wherein the second plug connector element is set up to be connected, so as to be releasable again, to the first plug connector element, and wherein the converter electronics are set up to receive a digital signal according to the first communications protocol via the second plug connector coupling, and, based thereupon, to generate a second digital signal according to a second communications protocol that differs from the first communications protocol and output said second digital signal via the third plug connector element; and a signal cable having a cable circuit and a third electronics housing surrounding the cable circuit, wherein the signal cable is connected at one end mechanically to the third electronics housing and electrically to the cable circuit, wherein the third electronics housing has a fourth plug connector element that is complementary to both the first plug connector element and the third plug connector element, wherein the cable circuit is set up to receive digital signals—in particular, both digital signals according to the first communications protocol and digital signals according to the second communications protocol—and to forward them via the signal cable.

By means of this modular system, on the one hand, a measurement arrangement may be provided that forgoes a conventional measuring transducer, like the additional measurement arrangement according to the present disclosure as indicated above or a measurement arrangement according to the embodiments described in the preceding. However, by means of this modular system, it is also possible to provide a measurement arrangement, similar to the measurement arrangement depicted in FIG. 1, which comprises a conventional measuring transducer that is additionally designed as an indicator and operator device. The cable circuit of the signal cable may, as mentioned above, advantageously be transparent in both directions, i.e., it is conductive to signals of various protocols.

The modular system may additionally comprise a first operator device—in particular, a portable operator device—wherein the at least one electronics module comprises at least one communications interface for wireless communication of the transducer electronics with the operator device, said communications interface being arranged in the second housing, and wherein the operator device has a communications interface matching the communications interface of the at least one electronics module. The wireless communication may take place by means of the aforementioned standard for wireless communication. The communications interface of the electronics module may similarly be set up for wireless communication of the transducer electronics with the superordinate unit.

The modular system may additionally comprise a second operator device—in particular, an operator device that can be connected to a superordinate unit—which second operator device has a housing; operator device electronics arranged in the housing; at least one manually operable input element which is set up to input data for the operator device electronics; at least one indicator device—in particular, a display; a signal input; a fifth plug connector element electrically coupled to the signal input; a signal output; and a sixth plug connector element electrically coupled to the signal output and/or the operator device electronics, wherein the signal input can be electrically coupled to the signal cable, and the signal output can be electrically coupled to the superordinate unit, and wherein the fifth plug connector element is designed as complementary to the second plug connector element, and can be connected, so as to be releasable again, to the second plug connector element; and wherein the sixth plug connector element is designed as complementary to the third plug connector element, and can be connected, so as to be releasable again, to the third plug connector element, and wherein the fifth plug connector element is set up to receive via the signal input a digital signal according to the first communications protocol, and to output said digital signal to the second plug connector element if the second plug connector element is connected to the fifth plug connector element, and wherein the sixth plug connector element is set up to receive a digital signal according to the second communications protocol from the third plug connector element if the third plug connector element is connected to the sixth plug connector element, and to output said digital signal to the signal output and/or the operator device electronics.

This second operator device may take on the function of a conventional measuring transducer, in that its signal input is electronically coupled to the signal cable, the signal cable is connected directly to the sensor by forming a plug connector coupling between the first and fourth plug connector elements, and the signal output of the second operator device is electrically coupled to the superordinate unit. The electronics module may be inserted into the second operator device via plug connector couplings to the fifth plug connector element and the sixth plug connector element. The second operator device may therefore use the transducer electronics present in the electronics module, so that the second operator device itself does not need to comprise its own circuit that provides the functions of generation and output of a second digital signal according to a second communications protocol (which differs from the first communications protocol) based upon the first digital signal received via the signal cable (bridge function), and, as necessary, provides the determination of a measurement value of the measured quantity and the generation of the second digital signal in such a manner that it represents the measurement value (transmitter function). The operator device electronics may provide additional functions of the second operator device, e.g., the indication of measurement values via the indicator device, the processing of inputs via the input element, or diagnostic functions.

All plug connector elements may, advantageously, respectively have a transmission coil, arranged within a housing or housing part of the respective plug connector element, to form an inductively-coupling interface transmitting—in particular, simultaneously transmitting—digital signals and electrical power. The plug connector elements may, alternatively, also have galvanic plug contacts.

The first electronics housing and the second electronics housing may respectively be designed, at least in segments, as a hollow cylinder, and may respectively have an outer diameter of less than 20 mm—preferably, between 12 and 16 mm. The third electronics housing may also be designed, at least in segments, as a hollow cylinder—in particular, having a largest outer diameter of less than 20 mm, and, preferably, between 12 and 16 mm. As mentioned in the preceding, the electronics housing may at least partially contain a casting compound surrounding the circuits contained therein, and/or be protected against the penetration of foreign substances and moisture. They may thereby be designed in conformity with the additional aforementioned standards and rules for example, IEC 60079-18:2014, IEC 60529:1989+A1:1999+A2:2013 or DIN EN 60529.

The transducer electronics of the electronics module may be set up to determine from the first digital signal at least one measurement value for the measured quantity and may additionally be set up to generate the second digital signal so that it represents the determined measurement value.

The modular system may additionally comprise a superordinate unit that is set up to receive and process a digital signal according to the second communications protocol. The superordinate unit is, in particular, not set up to be able to process the first digital signal, or a digital signal according to the first communications protocol. By means of the interposition of the electronics module serving as a bridge or transmitter between the sensor and the superordinate unit, the superordinate unit is placed in the position to communicate with the sensor electronics. The superordinate unit may be set up to be connected to the signal cable.

The present disclosure also relates to a method for putting a measurement arrangement into operation, using the modular system according to one of the embodiments described in the preceding, including:

connecting the sensor to the electronics module;

connecting the electronics module to the superordinate unit;

bringing the measurement sensor element into contact with a measurement medium, and generating an electrical measurement signal dependent upon a measured quantity of the measurement medium;

deriving a first digital signal according to a first communications protocol from the electrical measurement signal by means of the sensor electronics, and outputting the first digital signal via the first plug connector element to the electronics module;

receiving the first digital signal via the second plug connector element by means of the transducer electronics;

based upon the digital signal, generating a second digital signal according to a second communications protocol, which differs from the first communications protocol, by means of the transducer electronics, and outputting the second digital signal via the third plug connector element to the superordinate unit; and processing the second digital signal via the superordinate unit.

The generation of the second digital signal based upon the first digital signal may include the determination of a measurement value for the measured quantity from the first digital signal. In this instance, the second digital signal is generated so that it represents the determined measurement value.

The connection of the sensor to the electronics module may include the connection of the first plug connector element to the second plug connector element to form a first plug connector coupling, and the connection of the electronics module to the superordinate unit may include the connection of the electronics module to the signal cable connected to the superordinate unit via connection of the third plug connector element to the fourth plug connector element to form a second plug connector coupling.

Alternatively, the connection of the sensor to the electronics module may include:

connection of the signal cable to the signal input of the second operator device, arrangement of the electronics module in the housing of the second operator device, and connection of the second plug connector element to the fifth plug connector element; and connection of the signal cable to the sensor via connection of the first plug connector element to the fourth plug connector element; and the connection of the electronics module to the superordinate unit may include the connection of the third plug connector element to the sixth plug connector element, and the connection of the signal output of the second operator device to the superordinate unit.

The electronics module may include a data storage in which is stored a computer program providing functionalities of the measurement arrangement, which computer program can be executed by a microcontroller of the electronics module. To provide a new version of the computer program, the electronics module may be replaced by a replacement electronics module that is designed with structure identical to that of the electronics module and that contains the new version of the computer program in its memory, which corresponds to the data storage of the electronics module. This is a very simple possibility for providing a new version of the computer program to a measurement arrangement.

The electronics module may be set up to store data in—particular, measurement location-specific data—and diagnostic data, e.g., a load of the sensor at the measurement location at which it is used, in its data storage. The electronics module may, in particular, serve as a data logger, in that it stores measurement values, possibly linked to the point in time of their detection, in its data storage.

BRIEF DESCRIPTION OF THE DRAWINGS

The present disclosure is explained in further detail below on the basis of the exemplary embodiments shown in the illustrations. The figures show:

FIG. 4 shows a schematic depiction of a method for updating a computer program providing functionalities of a measurement arrangement.

DETAILED DESCRIPTION

Figure 1:
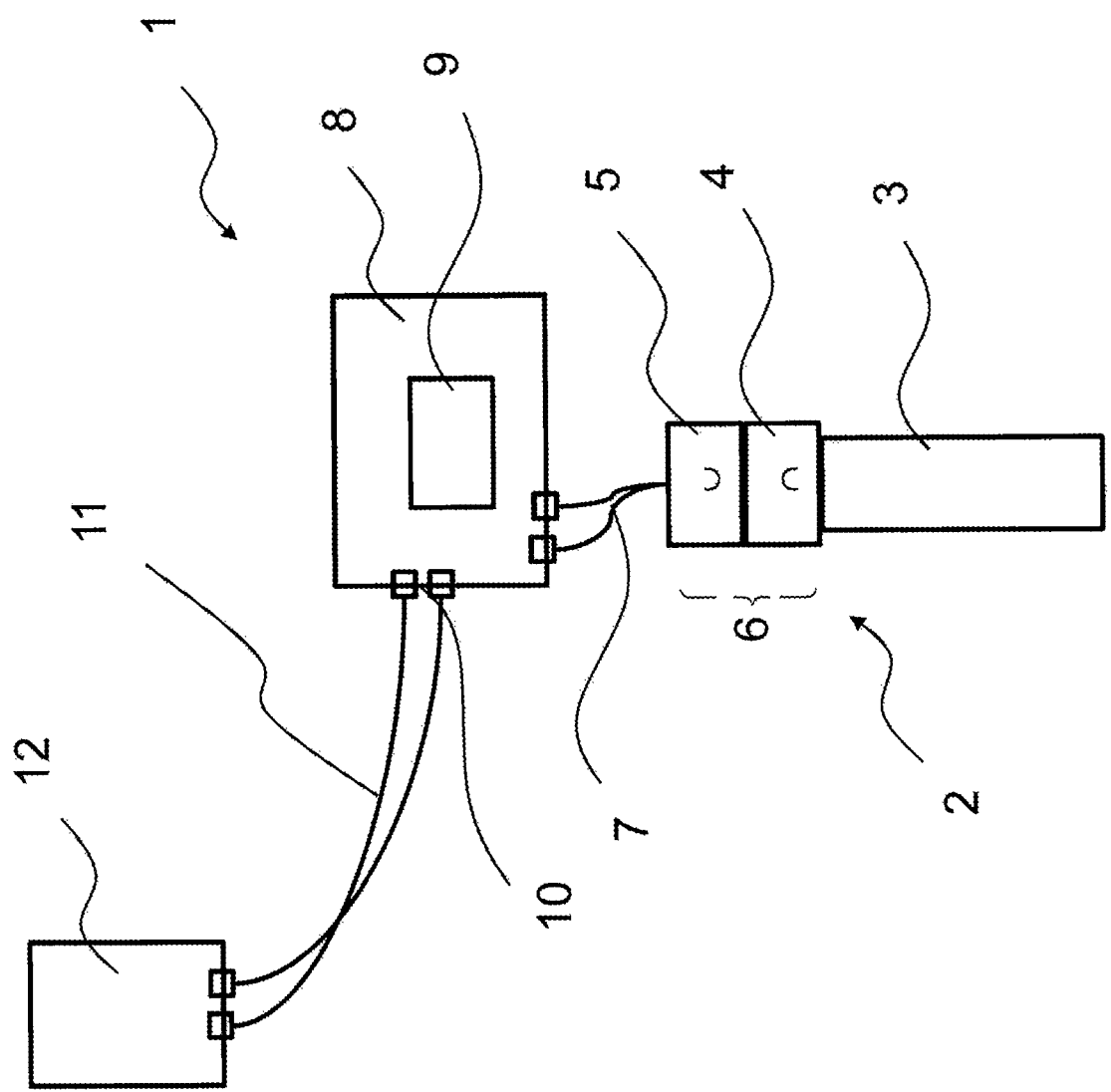
FIG. 1 shows a schematic depiction of a measurement arrangement known in the prior art.
Figure 2:
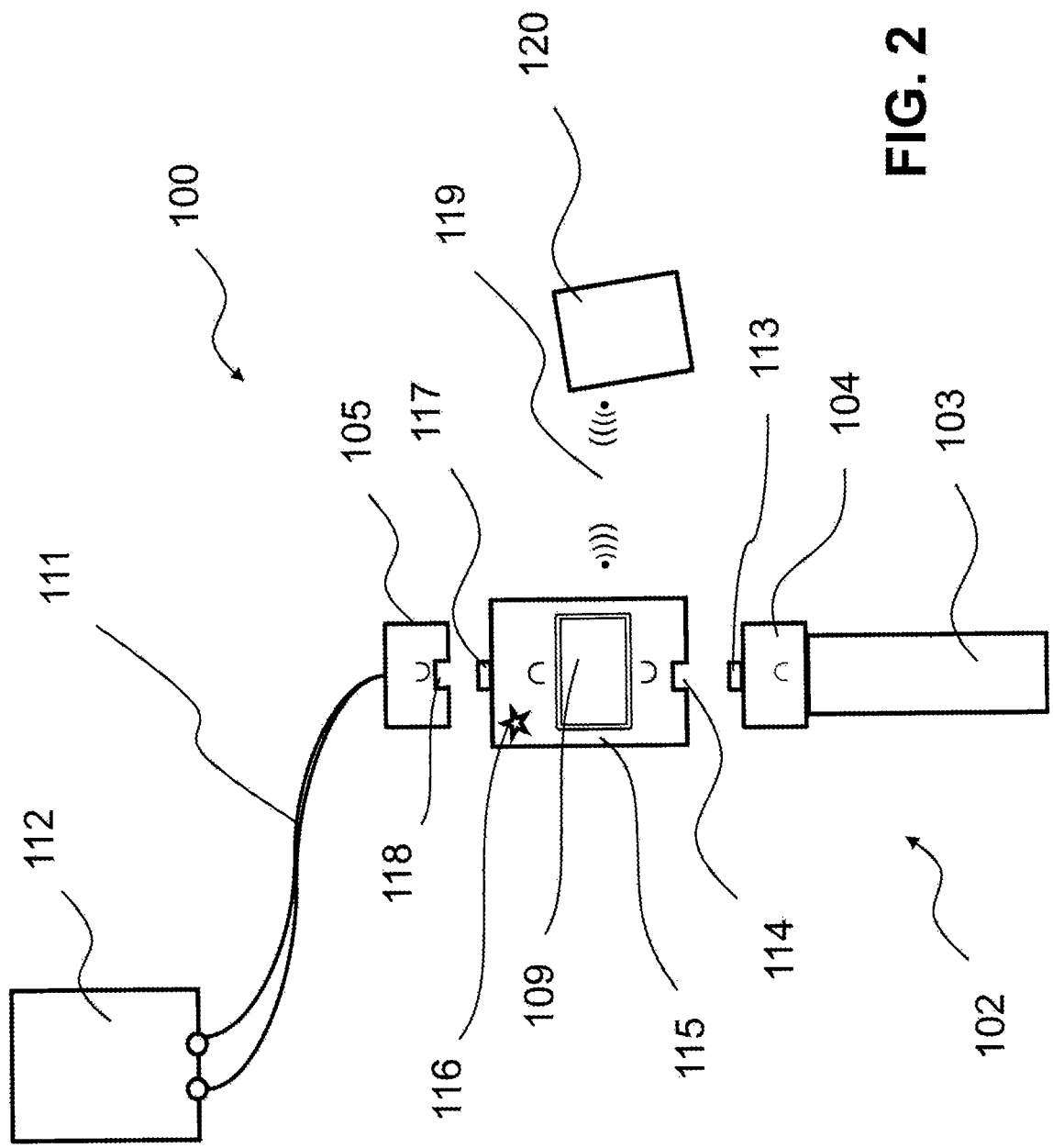
FIG. 2 shows a schematic depiction of a measurement arrangement with a sensor, an electronics module, a signal cable, and a superordinate unit, and an operator device for operation of the measurement arrangement.

Schematically depicted in FIG. 2 is a measurement arrangement 100 that is suitable for determining measurement values of measured quantity, e.g., a pH value or another analysis measured quantity, of a measurement medium.

The measurement arrangement 100 comprises a sensor 102 that has a measurement sensor element 103 and a first electronics housing 104 firmly connected to the measurement sensor element 103. In the present example, the measurement sensor element 103 is designed as a potentiometric pH measurement sensor element that generates and outputs as an analog measurement signal a voltage representing the pH value of a measurement medium contacting the measurement sensor element 103. The electronics housing 104 is designed in the form of a sensor plug head into which is integrated a first plug connector element 113. The sensor 102 can be connected to an electronics module 115 via a first plug connector coupling which may be formed from the first plug connector element 113 of the sensor 102 and a second plug connector element 114 that is integrated into the electronics housing of the electronics module 115.

The electronics module 115 has a third plug connector element 117 integrated into the electronics housing. This third plug connector element 117 may be connected to a fourth plug connector element 118 that is complementary to the third plug connector element 117 to form a second plug connector coupling. The fourth plug connector element 118 is integrated into an additional electronics housing 105 that is connected to a signal cable 111. At its other end, the signal cable 111 is connected to a superordinate unit 112 that, for example, may be designed as a programmable logic controller or as a process control center.

Like the electronics housing 104, the electronics module 115 is designed to be compact so that the measurement arrangement may also be used at a measurement location in which little space is available for measurement devices and/or that is difficult to access. In the exemplary embodiment depicted here, the electronics module 115, the electronics housing 104, and the housing 105 connected to the signal cable 111 are designed as hollow cylinders and have an outer diameter of less than, at most, 20 mm. The circuits arranged in the housing may be enclosed in a casting compound.

Sensor electronics that comprise an analog/digital converter for converting the analog signal into a digital signal are accommodated in the electronics housing 104 of the sensor 102. The sensor electronics may additionally comprise a memory in which are stored sensor-specific data in particular, calibration data of the sensor 102. The sensor electronics additionally comprise a processor that prepares the digital signal and outputs it in a telegram according to a first communications protocol, e.g., a proprietary protocol, to the electronics module 115 via the first plug connector coupling formed from the first plug connector element 113 and the second plug connector element 114. The first and second plug connector elements 113, 114 may respectively comprise coils, which coils are inductively coupled to one another so that power and data can be transmitted wirelessly via the first plug connector coupling. In this way, a galvanic separation of the sensor 102 from the remainder of the measurement arrangement 100 in particular, from the electronics module 115 may be achieved. The sensor electronics thus serve essentially to prepare the digital signal for wireless transmission to the electronics module 115.

The electronics module 115 comprises a transducer electronics 109 arranged in its electronics housing, which transducer electronics 109 include at least one processor and a memory in which is stored a computer program providing the functions of the electronics module 115. The processor is designed to execute this computer program. The transducer electronics 109 are set up to receive and process the digital signal generated by the sensor electronics. For example, the transducer electronics may be designed to determine from the received digital signal a measurement value of the measured quantity in the unit of the measured quantity; in the present example, this is thereby a pH value of the measurement medium. For this, the transducer electronics are set up to read out the calibration data stored in the memory of the sensor electronics for zero point and slope of a linearized characteristic sensor curve and to associate a measurement value to the measurement signal of the sensor using the characteristic sensor curve. The transducer electronics are additionally set up to generate a digital signal representing the measurement value, and to output said digital signal as a telegram according to a second communications protocol via the second plug connector coupling, which is formed from the third plug connector element 117 and the fourth plug connector element 118. The second communications protocol may be an industry standard communications protocol for example, a fieldbus protocol according to the IEC 61784-1 standard or the IEC 61784-2 standard.

Like the first and second plug connector elements 113, 114, the third and fourth plug connector elements 117, 118 may respectively comprise coils, and thus can be inductively coupled to one another. This allows a wireless transmission of power and data via the second plug connector coupling as well. The transducer electronics 109 are designed to prepare the telegram to be transmitted via the plug connection accordingly for wireless transmission via the second plug connector coupling. Alternatively, all plug connector elements may also have galvanic plug contacts.

A cable circuit that has a repeater function or router function, said cable circuit being electrically connected to the plug connector element 118 and the signal cable 111, may be contained in the housing 105 connected to the signal cable 111. This cable circuit serves to receive and forward the digital signal output by the electronics module 115. The cable circuit may possibly be set up to prepare and amplify the digital signal before forwarding. The signal is then transmitted to the superordinate unit 112 via the signal line 111 connected to the plug connector element 118, which signal line 111 may be a standard industry bus, for example.

In the present example, the electronics module 115 has an optical indicator 116 integrated into its electronics housing, which optical indicator comprises one or more LED's. This optical indicator may, for example, serve to display information regarding the data transmission via the first or second plug connector coupling. For example, by means of the indicator, it may be shown that data are currently being transmitted, or the indicator may output a warning signal if the data transmission is disrupted.

The electronics module 115 may comprise an identifier for example, in the form of a barcode, a QR code, and/or an RFID tag. The identifier may serve to identify the electronics module 115. The identifier may be stored in a table or database in which functions of the electronics module, additional information about the electronics module 115, and information about the measurement location at which the electronics module 115 is inserted into a measurement arrangement are associated with the identifier, e.g., calibration data, information regarding the (remaining) service life, maintenance cycles or cleaning cycles, or selected measurement data and operating data of the measurement location formed by means of the electronics module 115 and the associated sensor 102.

The measurement arrangement 100 also comprises an operator device 120. The transducer electronics 109 may comprise a radio interface via which they may communicate wirelessly with an operator device 120 that, for this purpose, has a radio interface matching the transducer electronics radio interface. The radio interface may also be set up to communicate with the superordinate unit 112. The operator device 120 may, for example, be a portable computer, a tablet PC, a mobile telephone, a smartwatch, head-mounted display glasses, or another portable operator device. The operator device 120 may also be a drone in particular, a flight-capable drone that is designed to communicate wirelessly with the transducer electronics 109 and to collect read-out data and/or transmit read-out data to a remote server (cloud). The radio connection 119 between the transducer electronics 109 and the operator device 120 may, for example, take place according to a Bluetooth, wireless HART, or wireless LAN standard.

The operator device 120 may additionally be set up to determine the cited identifier of the electronics module 115 for example, by reading the QR code or by reading out the identifier from the RFID tag of the electronics module 115. For this, it may contain a camera or an RFID reader. The operator device 120 may be set up to access the table or database with additional information regarding the electronics module 115, or regarding the measurement location at which the electronics module 115 is used in a measurement arrangement. This may be stored either locally in the operator device 120 or on a remote server (cloud). To communicate with the remote server, the operator device 120 may use the wireless LAN interface or another communications interface for (in particular, wireless) communication for example, GSM or UMTS.

The fourth plug connector element 118 is mechanically and electrically compatible, not only with the third plug connector element 117, but also with the first plug connector element 113, and thus with that of the electronics housing 104. Since the cable circuit that is arranged in the housing 105 and can be connected to the fourth plug connector element 118 serves merely as a repeater or router, and, there, merely prepares received digital signals, but does not further process them in terms of their content, they prepare and relay via the signal cable 111, not only digital signals according to the communications protocol output by the transducer electronics 109, but, rather, any other digital signals. In particular, the fourth plug connector element 118 may thus be connected to the first plug connector element 113, and may receive digital signals according to the proprietary communications protocol used by the sensor electronics, said digital signals being output by the sensor electronics, and forward them via the cable circuit arranged in the housing 105, which cable circuit prepares the received digital signals and forwards them via the signal cable 111.

The components of the measurement arrangement 100 depicted in FIG. 2 may thus be parts of a modular system for forming a measurement arrangement. In addition to the sensor 102 shown in FIG. 2, the electronics module 115, the signal cable 111 with the housing 105, and the operator device 120, an additional operator device that may take on the functions of a conventional measuring transducer may belong to this modular system. These functions, on the one hand, include the functions of the transducer electronics 109, viz., the determination of measurement values from measurement signals of the sensor 102 and the communication of the determined measurement values to a superordinate unit according to a communications protocol that can be processed by said superordinate unit, and, on the other hand, also indicator and operation functions by means of which a user may read out data in particular, measurement values from the transducer electronics 109 and input parameters and commands to the transducer electronics or the sensor 102.

Figure 3:
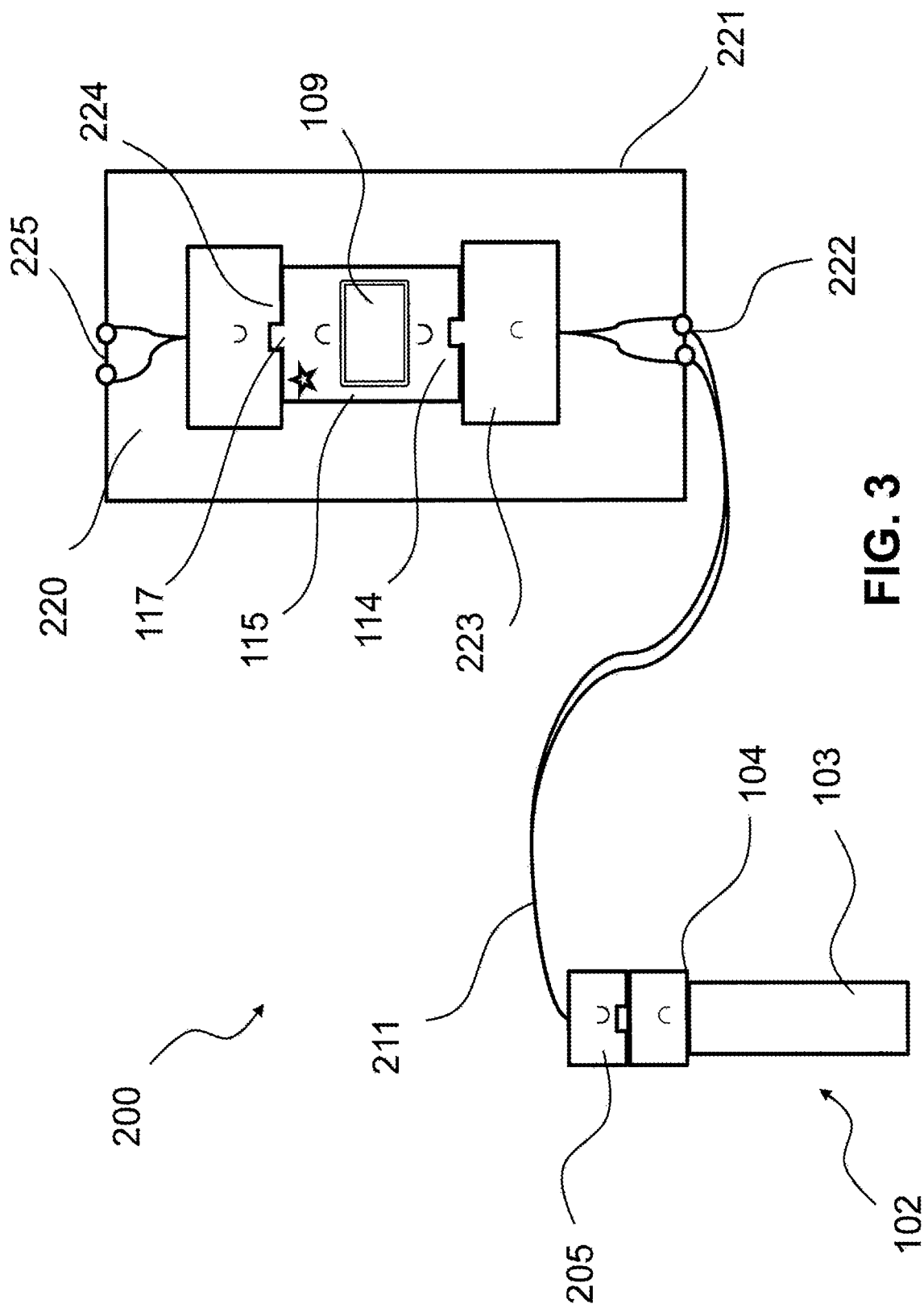
FIG. 3 shows a measurement arrangement with a sensor and an operator device.

Depicted in FIG. 3 is a measurement arrangement 200 having such an operator device 208 providing the functions of a conventional measuring transducer, which operator device 208 is assembled by means of the mentioned modular system. The measurement arrangement 200 comprises: the sensor 102, which is designed to be identical to the sensor of the measurement arrangement 100 depicted in FIG. 2; a signal cable 211 with a plug connector element integrated into a housing 205; and a cable circuit contained in the housing 205, which cable circuit is designed to be identical to the signal cable 111 having the fourth plug connector element 118 of the measurement arrangement 100 depicted in FIG. 2, said fourth plug connector element 118 being integrated into the housing 105; and an operator device 220.

The operator device 220 has a housing 221 in which is arranged an electronics module 115 that is designed to be identical to the electronics module 115 of the measurement arrangement 100 depicted in FIG. 2. The electronics module 115 is connected to the sensor 102 via a plug connector coupling that is formed from a plug connector element 114 of the electronics module 115 and a plug connector element 223 complementary thereto, said plug connector element 223 likewise being arranged within the housing 221. The plug connector element 223 is connected via an interface 222 to the signal cable 211, which, for its part, is connected to the sensor 102 via an additional plug connector coupling which is formed from the plug connector element integrated into the housing 205 and the plug connector element 104 of the sensor 102. In the present example, the plug connector coupling formed from the plug connector elements 114 and 223, and the plug connector coupling formed from the plug connector element integrated into the electronics housing 104 of the sensor 102 and the plug connector element integrated into the housing 205 are, like the plug connector couplings of the measurement arrangement 100 according to FIG. 2, designed as inductively-coupling plug connector couplings. They may alternatively also comprise galvanically-coupling plug contacts.

Arranged in the housing 221 is an additional plug connector element 224 that is designed as complementary to the plug connector element 117 of the electronics module 115. In the present example, the plug connector elements 224 and 117 are connected to one another to form an additional, inductively-coupling plug connector coupling. The plug connector element 117 is electrically connected to a signal output 225 of the operator device 220 that, for its part, may be connected to the superordinate unit. However, it is also possible to operate the measurement arrangement 200 depicted in FIG. 3 without connection to a superordinate unit.

The two plug connector couplings 223, 224 provided within the housing 221 of the operator device 220 for connection of the electronics module 115 may respectively be integrated into a separate housing, wherein a repeater circuit or router circuit that is designed to receive and forward digital signals may be contained in at least one of the two housings. In addition to this, the repeater circuit or router circuit may possibly be set up to amplify or prepare the digital signals before forwarding.

The operator device 220 may comprise an indicator device for example, a display an input device having one or more input elements for example, having a keyboard and/or one or more rotary switches or pushbuttons and operator device electronics. The operator device electronics may be electrically connected to the plug connector 224 in order to communicate with the electronics module 115 via the plug connector coupling formed from the plug connector element 224 and the plug connector element 117 of the electronics module 115 for example, in order to read out data from the transducer electronics 109 or in order to modify parameters stored in the transducer electronics 109. The operator device electronics may thus provide additional functions of the operator device 220; for example, they provide the indication of measurement values that are provided via the transducer electronics 109 or the input of parameters for operation of the measurement arrangement by a user. The operator device electronics may also include additional functionalities, e.g., the determination of diagnostic values such as the remaining service life of the sensor 102, the calibration quality of the measurement arrangement 200, the measurement value quality, or the time until the next calibration of the sensor 102.

An especially simple updating of the functions of the measurement arrangement provided by a computer program stored in a memory of the transducer electronics 109 is also possible via the modular design of the measurement arrangements 100 and 200 described here. This is schematically depicted in FIG. 3 using the measurement arrangement 100 depicted in FIG. 2. To update the computer program, here, the electronics module 115 with the transducer electronics 109 is replaced by a new electronics module 115 having transducer electronics 109' that may be identical in design, in terms of hardware, to the transducer electronics 109, but that include a different for example, a more current or a modified—version of the computer program in a memory, corresponding to the memory of the transducer electronics 109 that contains the computer program. Analogously, an update may also be performed in the measurement arrangement 200 depicted in FIG. 3.

Additional data relating, for example, to the measurement arrangement 100, 200 in particular, to the sensor 102 and/or the measurement location at which the measurement arrangement 100, 200 is used may be stored in the memory of the transducer electronics 109. In particular, the transducer electronics 109 may include a data logger function.

The invention claimed is:

1. A measurement arrangement, comprising:
a sensor including a measurement sensor element, sensor electronics electrically connected to the measurement sensor element, a first electronics housing surrounding the sensor electronics, said first electronics housing being firmly mechanically connected to the measurement sensor element, and a first plug connector integrated into the first electronics housing, wherein the measurement sensor element is configured to generate an electrical measurement signal dependent upon a measured quantity of a measurement medium in contact with the sensor, and wherein the sensor electronics are configured to generate a first digital signal derived from the electrical measurement signal and according to a first communications protocol, and to output said first digital signal via the first plug connector;
an electronics module including transducer electronics disposed in a second electronics housing, a second plug connector integrated into the second electronics housing, the second plug connector is complementary to the first plug connector, and a third plug connector integrated into the second electronics housing, wherein the second plug connector is releasably connected to the first plug connector to form a first plug connector coupling, and wherein the transducer electronics are configured to receive the first digital signal transferred via the first plug connector coupling, and, based thereupon, to generate a second digital signal according to a second communications protocol that differs from the first communications protocol and to output said second digital signal via the third plug connector;
a superordinate unit; and
a signal cable connected to the superordinate unit, the signal cable including a cable circuit and a third electronics housing surrounding the cable circuit, wherein the signal cable is connected at one end mechanically to the third electronics housing and electrically to the cable circuit, wherein the third electronics housing includes a fourth plug connector detachably connectable to the third plug connector element to form a second plug connector coupling, said fourth plug connector complementary to both the first plug connector and the third plug connector, wherein the cable circuit is configured to relay the second digital signal received via the second plug connector coupling to the superordinate unit, and wherein the superordinate unit is configured to receive and to process the second digital signal supplied via signal cable and is not configured to process the first digital signal or a digital signal according to the first communications protocol.

2. The measurement arrangement according to claim 1, wherein the transducer electronics are further configured to determine from the first digital signal at least one measurement value for the measured quantity and to generate the second digital signal as to represent the determined measurement quantity.

3. The measurement arrangement according to claim 1, wherein the first electronics housing is embodied at least partially as a hollow cylinder having an outer diameter of less than 20 mm, and wherein the second electronics housing is embodied at least partially as a hollow cylinder having an outer diameter of less than 20 mm.

4. The measurement arrangement according to claim 1,
wherein the sensor electronics include a non-volatile first memory in which are stored sensor-specific data,
wherein the transducer electronics include at least one microprocessor and a non-volatile second memory in which is stored a computer program which can be executed by the at least one microprocessor, and
wherein the computer program is configured to read out the sensor-specific data from the first memory and determine the at least one measurement value for the measured quantity from the first digital signal received via the first plug connector coupling, using the sensor-specific data.

5. The measurement arrangement according to claim 1, wherein the first communications protocol is a proprietary communications protocol that cannot be processed by the superordinate unit.

6. The measurement arrangement according to claim 1,
wherein the first plug connector coupling is a galvanically separate inductive or capacitive coupling embodied to transfer data and electrical power simultaneously, the electrical power to supply the sensor, and
wherein the second plug connector coupling is a galvanically separate inductive or capacitive coupling embodied to transfer data and electrical power simultaneously, the electrical power to supply the sensor and the electronics module.

7. The measurement arrangement according to claim 1, further comprising:
a portable operator device,
wherein the electronics module further includes at least one communications interface enabling wireless communication of the transducer electronics with the portable operator device, the communications interface embodied as a radio interface including a transmission unit and reception unit, and
wherein the portable operator device includes a communications interface matching the communications interface of the electronics module.

8. The measurement arrangement according to claim 1, the electronics module further includes a capacitive energy storage, a chemical energy storage, or a rechargeable chemical energy storage.

9. A modular system for forming a measurement arrangement, comprising:
a sensor including a measurement sensor element, sensor electronics electrically connected to the measurement sensor element, a first electronics housing surrounding the sensor electronics, said first electronics housing firmly mechanically connected to the measurement sensor element, and a first plug connector integrated into the first electronics housing, wherein the measurement sensor element is configured to generate an electrical measurement signal dependent upon a measured quantity of a measurement medium in contact with the sensor, and wherein the sensor electronics are configured to generate a first digital signal derived from the electrical measurement signal and to output said first digital signal via the first plug connector according to a first communications protocol;
at least one electronics module including transducer electronics disposed in a second electronics housing, a second plug connector integrated into the second electronics housing, which second plug connector is complementary to the first plug connector, and a third plug connector integrated into the second electronics housing, wherein the second plug connector is embodied to be releasably connected to the first plug connector, and wherein the transducer electronics are configured to receive the first digital signal according to the first communications protocol via the second plug connector, and, based thereupon, to generate a second digital signal according to a second communications protocol that differs from the first communications protocol and to output said second digital signal via the third plug connector;
a superordinate unit configured to receive and to process the second digital signal according to the second communications protocol, wherein the superordinate unit is not configured to process the first digital signal or a digital signal according to the first communications protocol; and
a signal cable including a cable circuit and a third electronics housing surrounding the cable circuit, wherein the signal cable is connected at one end mechanically to the third electronics housing and electrically to the cable circuit,
wherein the third electronics housing includes a fourth plug connector complementary to both the first plug connector and the third plug connector,
wherein the cable circuit is configured to receive both the first digital signal and the second digital signal and to forward the first digital signal and the second digital signal via the signal cable.

10. The modular system according to claim 9, further comprising:
a first portable operator device,
wherein the at least one electronics module further includes at least one communications interface for wireless communication of the transducer electronics with the first portable operator device, said communications interface being disposed in the second housing, and
wherein the first portable operator device includes a communications interface matching the communications interface of the at least one electronics module.

11. The modular system according to claim 9, further comprising:
a first operator device connectable to a superordinate unit, the first operator device including a housing, operator device electronics disposed in the housing, at least one manually operable input element configured to input data for the operator device electronics, at least one indicator device, a signal input, a fifth plug connector electrically coupled to the signal input, a signal output, and a sixth plug connector electrically coupled to the signal output and the operator device electronics,
wherein the signal input is configured to be electrically coupled to the signal cable, and the signal output is configured to be electrically coupled to the superordinate unit,
wherein the fifth plug connector is embodied to be complementary to the second plug connector and to be releasably connected to the second plug connector,
wherein the sixth plug connector is embodied to be complementary to the third plug connector and to be releasably connected to the third plug connector, wherein the fifth plug connector is further embodied to receive via the signal input the first digital signal according to the first communications protocol and to output said first digital signal to the second plug connector if the second plug connector is connected to the fifth plug connector, and wherein the sixth plug connector is further embodied to receive a second digital signal according to the second communications protocol from the third plug connector if the third plug connector is connected to the sixth plug connector and to output said second digital signal to the signal output and the operator device electronics.

12. The modular system according to claim 9, wherein all plug connectors respectively have a transmission coil, arranged within a housing or housing part of the respective plug connector, to form an inductively-coupling interface configured to transmit simultaneously digital signals and electrical power.

13. The modular system according to claim 9, wherein the first electronics housing is embodied at least partially as a hollow cylinder having an outer diameter less of than 20 mm and wherein the second electronics housing is embodied at least partially as a hollow cylinder having an outer diameter of less than 20 mm.

14. The modular system according to claim 9,
wherein the transducer electronics are configured to determine from the first digital signal at least one measurement value for the measured quantity, and
wherein the transducer electronics are configured to generate the second digital signal as to represent the measured quantity.

15. The modular system according to claim 9, wherein the superordinate unit is configured to be connected to the signal cable.

16. A method for placing in operation a measurement arrangement, comprising:
providing a modular system, including,
a sensor including a measurement sensor element, sensor electronics electrically connected to the measurement sensor element, a first electronics housing surrounding the sensor electronics, and a first plug connector,
an electronics module including transducer electronics, a second plug connector, and a third plug connector,
a superordinate unit,
a signal cable connected to the superordinate unit and including a fourth plug connector, and
a first operator device including a housing, operator device electronics disposed in the housing, a signal input, a fifth plug connector electrically coupled to the signal input, a signal output, and a sixth plug connector electrically coupled to the signal output;
connecting the sensor to the electronics module;
connecting the electronics module to the superordinate unit;
bringing the measurement sensor element into contact with a measurement medium and generating an electrical measurement signal dependent upon a measured quantity of the measurement medium;
deriving a first digital signal according to a first communications protocol from the electrical measurement signal using the sensor electronics and outputting the first digital signal via the first plug connector to the electronics module;
receiving the first digital signal via the second plug connector using the transducer electronics;
based upon the first digital signal, generating a second digital signal according to a second communications protocol, which differs from the first communications protocol, using the transducer electronics and outputting the second digital signal via the third plug connector to the superordinate unit, wherein the superordinate unit is configured to receive and to process the second digital signal according to the second communications protocol and is not configured to process the first digital signal or a digital signal according to the first communications protocol; and
processing the second digital signal via the superordinate unit.

17. The method according to claim 16,
wherein connecting the sensor to the electronics module includes connecting the first plug connector to the second plug connector to form a first plug connector coupling, and
wherein connecting the electronics module to the superordinate unit includes connecting the electronics module to the signal cable connected to the superordinate unit via connection of the third plug connector to the fourth plug connector to form a second plug connector coupling.

18. The method according to claim 16,
wherein connecting the sensor to the electronics module includes: connecting the signal cable to the signal input of the first operator device, connecting the second plug connector to the fifth plug connector, and connecting the signal cable to the sensor by connecting the first plug connector to the fourth plug connector, and
wherein connecting the electronics module to the superordinate unit includes connecting the third plug connector to the sixth plug connector and connecting the signal output of the first operator device to the superordinate unit.

19. The method according to claim 16, wherein the electronics module includes a data storage in which is stored a computer program providing functionalities of the measurement arrangement, which computer program can be executed by a microcontroller of the electronics module; and wherein, to provide a new version of the computer program, the electronics module is replaced by a replacement electronics module that is identical in design, in terms of structure, to the electronics module, and that contains the new version of the computer program in its memory corresponding to the data storage of the electronics module.

* * * * *